US011366397B2

(12) United States Patent
Habets et al.

(10) Patent No.: US 11,366,397 B2
(45) Date of Patent: *Jun. 21, 2022

(54) METHOD AND APPARATUS FOR SIMULATION OF LITHOGRAPHY OVERLAY

(71) Applicant: Qoniac GmbH, Dresden (DE)

(72) Inventors: Boris Habets, Dresden (DE); Stefan Buhl, Dresden (DE)

(73) Assignee: Qoniac GmbH, Dresden (DE)

(*) Notice: Subject to any disclaimer, the term of this patent is extended or adjusted under 35 U.S.C. 154(b) by 175 days.

This patent is subject to a terminal disclaimer.

(21) Appl. No.: 16/535,304

(22) Filed: Aug. 8, 2019

(65) Prior Publication Data
US 2019/0361354 A1 Nov. 28, 2019

Related U.S. Application Data

(63) Continuation-in-part of application No. 13/938,720, filed on Jul. 10, 2013, now Pat. No. 10,379,447.

(51) Int. Cl.
G03F 7/20 (2006.01)
G03F 9/00 (2006.01)
G01N 21/95 (2006.01)

(52) U.S. Cl.
CPC ......... G03F 7/705 (2013.01); G01N 21/9501 (2013.01); G03F 7/70633 (2013.01); G03F 9/7046 (2013.01); G03F 9/7088 (2013.01)

(58) Field of Classification Search
CPC .... G03F 7/705; G03F 7/70633; G03F 9/7088; G03F 9/7003; G01N 21/9501
See application file for complete search history.

(56) References Cited

U.S. PATENT DOCUMENTS

| 5,525,808 | A  | * | 6/1996 | Irie | G03F 9/7003 |
|           |    |   |        |      | 250/548     |
| 6,686,107 | B2 |   | 2/2004 | Matsumoto et al. | |
| 6,699,627 | B2 | * | 3/2004 | Smith | G03F 7/70558 |
|           |    |   |        |      | 430/30      |
| 6,861,331 | B2 | * | 3/2005 | Rossiger | H01L 23/544 |
|           |    |   |        |      | 257/E23.179 |

(Continued)

FOREIGN PATENT DOCUMENTS

WO 2010020331 2/2010

OTHER PUBLICATIONS

Chen "Overlay modelling for proximity x-ray lithography", Journal of Vacuum Science and Technology B: Microelectronics and Nanometer Structures Processing, Measurement, and Phenomena 16, 3485 (1998).

Primary Examiner — Kibrom K Gebresilassie
(74) Attorney, Agent, or Firm — Hodgson Russ LLP

(57) ABSTRACT

A method for simulation of lithography overlay is disclosed which comprises storing alignment parameters used to align a semiconductor wafer prior to a lithography step; storing process control parameters used during the lithography step on the semiconductor wafer, storing overlay parameters measured after the lithography step, calculating alternative alignment parameters and alternative process control parameters. The alternative alignment parameters and the alternative process control parameters are added to cleansed overlay parameters to obtain simulated lithography overlay data.

8 Claims, 5 Drawing Sheets

(56) References Cited

U.S. PATENT DOCUMENTS

| | | | |
|---|---|---|---|
| 6,982,793 B1 * | 1/2006 | Yang | G03F 7/70633 356/401 |
| 7,009,704 B1 | 3/2006 | Nikoonahad et al. | |
| 7,556,899 B2 | 7/2009 | Ikeda et al. | |
| 7,571,420 B2 | 8/2009 | Wong et al. | |
| 7,783,444 B2 | 8/2010 | Habets et al. | |
| 7,804,580 B2 | 9/2010 | Kono | |
| 7,804,596 B2 | 9/2010 | Yoo | |
| 8,143,731 B2 | 3/2012 | Chiu | |
| 8,440,475 B2 | 5/2013 | Habets et al. | |
| 8,874,249 B2 | 10/2014 | Ausschnitt | |
| 8,982,320 B2 | 3/2015 | Okita | |
| 9,087,176 B1 | 7/2015 | Chang et al. | |
| 9,543,223 B2 * | 1/2017 | Habets | G03F 7/70633 |
| 2002/0183989 A1 | 12/2002 | Chien et al. | |
| 2003/0002043 A1 | 1/2003 | Abdulhalim et al. | |
| 2004/0101983 A1 * | 5/2004 | Jones | G03F 7/70633 438/14 |
| 2005/0154484 A1 | 7/2005 | Lee et al. | |
| 2005/0157297 A1 | 7/2005 | Abdulhalim et al. | |
| 2005/0209818 A1 | 9/2005 | Chao et al. | |
| 2006/0028645 A1 * | 2/2006 | Kawamura | G03F 7/70633 356/399 |
| 2007/0021860 A1 | 1/2007 | Gertrudus et al. | |
| 2008/0057418 A1 * | 3/2008 | Seltmann | G03F 7/70633 430/30 |
| 2008/0106714 A1 * | 5/2008 | Okita | G03F 9/7003 355/53 |
| 2008/0228435 A1 | 9/2008 | Lee et al. | |
| 2009/0248337 A1 * | 10/2009 | Habets | H01L 21/68 702/81 |
| 2009/0303482 A1 | 12/2009 | Levinski et al. | |
| 2010/0030360 A1 * | 2/2010 | Habets | G03F 7/70508 700/110 |
| 2010/0185311 A1 | 7/2010 | Hsieh et al. | |
| 2011/0053060 A1 * | 3/2011 | Tsubata | G03F 7/70666 430/30 |
| 2011/0196646 A1 * | 8/2011 | Mos | G03F 7/705 355/77 |
| 2012/0022679 A1 * | 1/2012 | Choi | G03F 7/70525 700/108 |
| 2012/0191236 A1 * | 7/2012 | Ausschnitt | G03F 7/705 700/105 |
| 2013/0258308 A1 | 10/2013 | Sakamoto | |
| 2014/0065528 A1 | 3/2014 | Kasa et al. | |
| 2016/0018741 A1 | 1/2016 | Liou et al. | |
| 2017/0277044 A1 | 9/2017 | Lee et al. | |
| 2019/0361354 A1 * | 11/2019 | Habets | G01N 21/9501 |

* cited by examiner

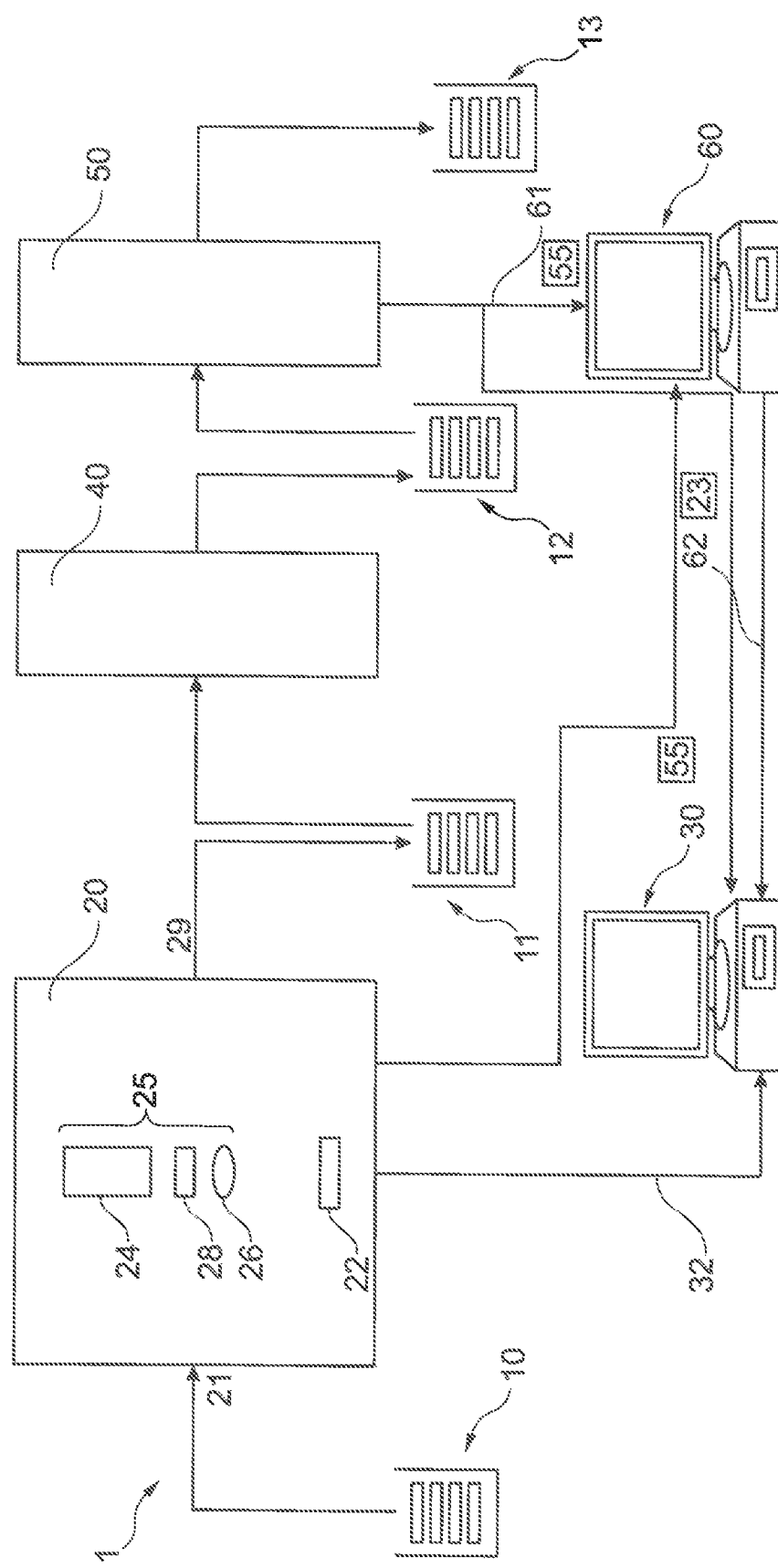

METHOD AND APPARATUS FOR SIMULATION OF LITHOGRAPHY OVERLAY

CROSS-REFERENCE TO RELATED APPLICATIONS

This patent application is a continuation-in-part of U.S. patent application Ser. No. 13/938,720, filed Jul. 10, 2013, Now U.S. Pat. No. 10,379,447, and is related to U.S. Provisional Application No. 61/590,665 "Method and Apparatus for Fabricating Wafers" filed on 25 Jan. 2012.

BACKGROUND OF THE INVENTION

Field of the Invention

This field of the present application relates in general to a method for the simulation of a lithography overlay and an apparatus for the simulation of a lithography overlay on the surface of a semiconductor wafer.

Brief Description of the Related Art

It will be appreciated that the term "semiconductor wafer" as used in this disclosure is intended to imply wafers used in the manufacture of all types of semiconductor devices, including, but not limited to, memory devices, ASICS, liquid crystal panels, and photovoltaic devices.

Current trends in the processing of the semiconductor wafers means that overlay budgets shrink with shrinking ground rules, and manufacturing processes are becoming more aggressive. Non-limiting examples of such aggressive manufacturing processes include high aspect ratio etching or deposition of exotic materials on a surface of the semiconductor wafer. The non-uniformity of some manufacturing processes over the semiconductor wafer surface and a plurality of manufacturing process steps may result in non-uniform stress being applied to the semiconductor wafer. When the semiconductor wafer deforms from one manufacturing process step to a subsequent manufacturing process step, e.g. from one lower layer to a subsequent layer on top of the lower layer, patterns in the upper layer may become misaligned to patterns in the lower layer. For the error free functioning of a semiconductor the relative position of patterns on the different layers to each is relevant. These relative positional errors are termed "overlay errors". The need for smaller and denser structures on the semiconductor wafer means that an allowable tolerance for the overlay errors decreases.

The overlay error is determined by means of so-called "overlay marks". In a lower layer together with the pattern for the semiconductor structure of the process step a first overlay mark is exposed in a photoresist film. After developing and processing this lower layer, the first overlay mark becomes part of the structure of this lower layer. On a higher layer in a subsequent process step together with the pattern for the semiconductor structure of the higher layer, a second overlay mark is exposed in a photoresist film. After development of the photoresist film the relative position error between the first overlay mark on the lower layer and the second overlay mark on the top layer can be measured in an overlay measurement tool. If the tolerance of the overlay error is too large the semiconductor wafer may be reworked with applied corrections. The goal is to use the measured overlay errors to compensate for the overlay errors in a next lot of semiconductor wafers, so as to minimize the overlay errors in the next lot and thus avoid costly rework.

From U.S. Published Patent Application No. 2010/0030360 ("US '360") a method of calculating "alignment" residuals in a fabrication unit is known that comprises providing an alignment model including alignment model parameters; providing an exposure tool suitable for exposing a lot of semiconductor wafers in a plurality of exposure fields; retrieving alignment data comprising alignment values, measured by the exposure tool on the semiconductor wafers of the lot at a plurality of positions of the exposure fields that are used to calculate values for the alignment model parameters of the alignment model; calculating a set of alignment residuals from the alignment data by subtracting effects of the alignment model parameters for each of the plurality of measured positions and for each of the semiconductor wafer in the lot; and issuing a warning signal based upon a comparison between the set of alignment residuals and a set of reference values. The US '360 document further comprises a system for calculating alignment residuals and a computer readable medium including instructions capable of performing the steps of calculating alignment residuals on a computer.

Ausschnitt et al. (U.S. Published Patent Application No. 2012/0191236) disclose a system and method for configuring and controlling a facility to perform a semiconductor manufacturing process for a semiconductor wafer as well as updating a tool controlling the semiconductor manufacturing process by calculating and storing of calculating coefficients. The method enables real-time control of variation in an exposure step of a patterning processing using an exposure tool to minimize a non-linear variation in one or more of the pattern attributes by adjusting the exposure tool or the patterning process corresponding to the calculated coefficients, which result from positioning a semiconductor wafer prior to a lithography step relative to manufacturing apparatus.

The coefficients are to adjust the relative positioning of the semiconductor wafer and the light source as well as projection optics in the exposure tools and, are determined based on alignment marks. The semiconductor wafer includes on its surface the so-called alignment marks and the positions of these alignment marks are measured relative to the exposure tool, and in particular relative to the light source and the projection optic.

US Patent Application Publication No. US 2009/0248337 (Habets et al.) teaches methods and systems for alternative overlay calculation and for calculating overlay stability which are based on using alternative overlay settings in a fabrication unit. Habets in the US'337 application teaches only the use of alternative overlay settings. Habets does not teach the use of alternative process control parameters for controlling the process of manufacture of the semiconductor wafer in the fabrication unit.

Ideally overlay measurements should be taken for each one of the semiconductor wafers at multiple positions on each exposure field on each of the semiconductor wafers to achieve a degree of precision and thus to achieve high yield rates for the fabrication of the semiconductor wafers. However, complete overlay measurements are very slow to perform, so they may cause a tool capacity problem. In other words, the time taken to perform a complete overlay measurement is a multiple of the time taken to process the semiconductor wafer. Thus, in order to provide the overlay measurements of each of the semiconductor wafers, a number of overlay measurement units has to be provided to distribute the overlay measurements on several parallel organised overlay measurement units.

The overlay measurement units are a significant cost factor in a semiconductor manufacturing process and for cost reasons the deployment of the parallel arranged overlay measurements units is avoided. Another solution for reducing limitations in the semiconductor manufacturing process whilst not extending the number of the overlay measurement units is to measure the overlay measurements in only a subset of the semiconductor wafers.

A reduction in the number of overlay measurements will increase the throughput of the semiconductor process. However, there will be a resultant reduction in the accuracy of the measurements and thus a reduction in the reliability of any values calculated from an interpolation of the measurements. This will not be serious if the absolute value of the overlay measurements only varies a little across the surface of the wafer. This assumption is not always valid.

Currently the only way of verifying the assumption is to carry out experiments which involve time and reduce the throughput of the semiconductor process.

SUMMARY OF THE INVENTION

The teachings of the disclosure provide a method for simulation of lithography overlay that enables simulations of alternative overlay measurements to be carried out. This in turn allows the testing of assumptions regarding the number of measurements that need to be carried out as well as providing a control method for optimising the throughput of the lithography process.

The method comprises storing alignment parameters used to align a semiconductor wafer in an exposure device prior to a lithography step, storing process control parameters used during the lithography step and storing overlay parameters measured after the lithography step. An alternative alignment/overlay model is defined, and alternative alignment parameters and alternative process control parameters are calculated. The alignment parameters and the process control parameters are subtracted from the stored overlay parameters to produce cleansed overlay measurement data. The alternative alignment parameters and the alternative process control parameters are added to the cleansed overlay measurement data to obtain simulated lithography overlay data.

The alternative alignment parameters, alternative overlay and alternative process control parameters generated from the alternative alignment/overlay model can be used to test alternative production strategies and alternative measurement strategies and thus allow a semiconductor process engineer to optimise the throughput of the semiconductor production process.

In this document, the term "alignment" is used to describe the projection of the pattern of the photo mask by the exposure device onto the surface of the semiconductor wafer. The term "overlay" is used in the present patent document to describe the relative positioning of structures within the semiconductor wafer, i.e. within the one or more layers of the semiconductor wafer. It will be noted that the terms "alignment" and "overlay" may be used differently by different authors and, indeed, in the previously cited US Patent Application Publication No US 2012/191236 (Ausschnitt) the term "alignment" corresponds to "overlay" used in this document.

The relative positioning of the structures within the semiconductor wafer being manufactured can be determined based on either on overlay marks (also termed, depending on the layer in which they appear, "reference marks" and "photoresist marks." Alternative features in the structures can be used as reference marks or overlay marks.

In one aspect of the invention, the alternative process control parameters can be fed to the exposure device. In a further aspect of the invention, the simulated lithography overlay data can be visualized on a visualization device to enable the semiconductor process engineer to understand the process.

The disclosure also teaches an apparatus for simulation of a lithography process on a surface of a semiconductor wafer. The apparatus comprises a non-volatile data store for storing alignment parameters used to align a semiconductor wafer prior to a lithographic step, process control parameters used during the lithography step as well as measured overlay data received from an overlay measurement tool. The apparatus includes a simulation processor for determining an alternative alignment/overlay model and calculating, from the alternative alignment/overlay model, alternative alignment parameters and alternative process control parameters. The simulation processor is further configured to subtract the stored alignment parameters and the stored process control parameters from the measured overlay data to obtain cleansed overlay data. Subsequently the simulation processor adds the alternative alignment parameters and the alternative process control parameters to the cleansed overlay data to obtain simulated overlay measurement data.

It will be appreciated that the semiconductor wafer can be a wafer for microelectronic circuits, such as memory devices or ASICS, liquid crystal panels as well as photovoltaic devices.

DESCRIPTION OF THE FIGURES

For a more complete understanding of the present invention and the advantages thereof, reference is now made to the following description and the accompanying drawings, in which:

FIG. 1 shows a first aspect of the present disclosure.

DETAILED DESCRIPTION OF THE INVENTION

Figure 2A:
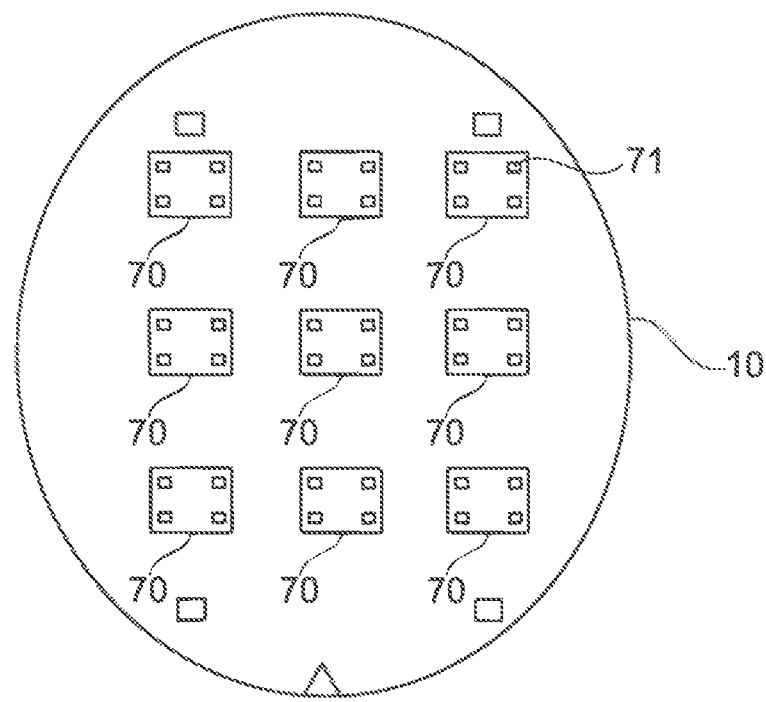
FIG. 2A shows wafer with exposure fields.

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

In the following, embodiments and/or implementations of the method and the apparatus are described with respect to simulating overlay measurements during a lithography step whilst manufacturing a semiconductor device on a semiconductor wafer. The embodiments, however, might also be useful in other respects, e.g., improvements in process control, improvements in identifying lot to lot variations of a layout pattern, yield enhancement techniques or the like.

Furthermore, it should be noted that the embodiments and/or implementations are described with respect to semiconductor wafers but might also be useful in other respects including but not limited to thin film elements. Other products, e.g., liquid crystal panels, ASICS, photovoltaic devices, or the like might be produced as well.

FIG. 1 shows in a schematic view a fabrication unit 1 for patterning a surface of a semiconductor wafer 10 and performing an overlay calculation and simulation. The fabrication unit 1 forms part of a semiconductor manufacturing system. The fabrication unit 1 comprises an exposure tool 20 for aligning and exposing portions of the surface of the semiconductor wafers 10, an exposure controller 30, a developing unit 40 for developing exposed ones of the semiconductor wafers 11, and an overlay measurement tool 50. The fabrication unit 1 also includes a simulation processor 60 shown here as a stand-alone computer, but which could be running as a software module on a server, in a cloud computer or on a local computer. The simulation processor 60 includes non-volatile memory for storage of data. The exposure controller 30 also includes a unit sometimes termed a R2R or run-to-run controller.

A plurality of semiconductor wafers 10, usually referred to as a lot, is loaded into the exposure tool 20. The semiconductor wafers 10 loaded into the exposure tool 20 have been coated with a photoresist film in a preceding process step. The exposure tool 20 includes a load port 21 for loading the semiconductor wafers 10 and an unload port 29 for unloading exposed ones of the semiconductor wafers 11. Within the exposure tool 20 the semiconductor wafers 10 are placed on a substrate holder 22.

A typical one of the semiconductor wafers 10 comprises a plurality of exposure fields 70 arranged on the semiconductor wafer 10 in a grid-like pattern, as schematically shown in FIG. 2. The plurality of exposure fields 70 usually are exposed one exposure field 70 after another exposure field 70. The substrate holder 22 is positioned by actuators (not shown) within the exposure device 20 at least in two dimensions to move the semiconductor wafer 10. Thus, each one of the exposure fields 70 on the semiconductor wafer 10 is positioned in turn using a projection system 25 as the semiconductor wafer 10 is stepped back and forth, and up and down within the substrate holder 22. The projection system 25 comprises a light source 24, a projection optic 26, and a photo mask 28. The semiconductor wafer 10 includes alignment marks that are used by the exposure tool 20 to align the surface of the semiconductor wafer 10 with the light source 24 and the projection optic 26 to ensure that the correct exposure field 70 is illuminated. Alignment data 23 from the alignment of the semiconductor wafer is generated by the exposure tool 20 and this alignment data 23 is transferred to the simulation processor 60.

Each time the semiconductor wafer 10 and the projection system 24, 26, 28 have been aligned, the photo mask 28 is illuminated with the light source 24 and the pattern from the photo mask 28 is projected on each individual exposure field 70 one exposure field at a time. The pattern on the photo mask 28 is used to generate a structure of one layer of the semiconductor device as well as overlay marks 71.

In one aspect of the system and method, the overlay marks 71 are used to determine overlay correction parameters to be used by the exposure tool 20 to project the photo mask 28 onto the correct portion of the surface of the semiconductor wafer 10 for the exposure field 70. Other ones of the overlay marks 71 will have been generated in a lower layer during a previous process step by a different exposure pattern in a previous photoresist layer during the exposure of the structure for this previous semiconductor layer (i.e. for a lower semiconductor layer). These lower overlay marks 71 in the previous photoresist layer are visible through later (upper) photoresist layers, as the photoresist layer is transparent. These lower overlay marks will be termed "reference marks" 74.

The overlay error is the difference between the expected position of the pattern of the individual exposure field 70 and the actual position of the pattern of the individual exposure field 70. The overlay error is measured in the overlay measurement tool 50, as described below. The overlay error can be corrected between specific pairs of the semiconductor layers of the semiconductor wafer 10. Different reference marks 74 are provided on different ones of the semiconductor layers and it is possible to see different ones of the reference marks 74 through multiple layers.

In another aspect of the system and method, the overlay marks 71 and reference marks 74 can be omitted. The overlay error is calculated as the difference between the expected positions of different structures in the different layers. This can be illustrated with respect to the insert 80 of FIG. 2 which shows an example of two structures on two different layers. A via 84 is placed over a contact line 82 and has dimensions L1 and L2 as shown on the Fig. The circuit designer will expect the dimensions L1 and L2 to have an expected value with a certain tolerance. The overlay measurement tool 50 can measure the values of these dimensions and can use the difference between the expected values and the measured values to calculate the overlay error.

In a further aspect of the invention, it is possible to use special test structures distributed throughout the wafer to determine the overlay errors.

It will be appreciated that the overlay measurement tool 50 uses visual inspection which can determine overlay errors between overlapping layers but may not be able to determine overlay errors between non-overlapping layers. It is possible to use ebeam inspection in order to view underlying layers and determine the overlay error with underlying structures.

The overlay error is often due to semiconductor wafer deformations, which are introduced to a semiconductor wafer 10 during the various process steps to which the semiconductor wafer 10 is exposed. The overlay measurement tool 50 calculates overlay correction parameters from the overlay error and passes the overlay parameters to the exposure controller 30 and to the simulation processor 60. The exposure controller 30 determines process correction parameters from the overlay correction parameters and passes the process correction parameters to the exposure tool 20.

The exposure tool 20 uses the process correction parameters to calculate the portion of the semiconductor wafer 10 onto which the pattern is to be projected. The process correction parameters provided by the exposure controller 30 are calculated for each one of the semiconductor wafers 10 (termed wafer fine model correction parameters) and each one of the exposure fields 70 (termed field fine correction parameters) on the semiconductor wafer 10. With the calculated process correction parameters, the semiconductor wafer 10 or the photo mask 28 can be shifted in either one or both of the x-direction or the y-direction, can be rotated around a vertical z-axis, or the projection system may be adjusted to a different magnification by disposing the projection system along the z-axis.

After the mask projection step, e.g. after all of the exposure fields 70 have been exposed with the pattern of the photo mask 28, each fully exposed semiconductor wafer 11 is unloaded via unload port 29 and the next semiconductor wafer 10 of the lot is loaded into the exposure tool 20 via the load port 21. After all of the exposed semiconductor wafers 11 of a lot have been exposed in the exposure tool 20, the entire lot of the exposed semiconductor wafers 11 is subsequently forwarded to a developing unit 40. In the developing unit 40, the exposed photoresist film on the top surface of the exposed semiconductor wafers 11 is developed by developing chemicals that wash away those unexposed areas of the photoresist film. In other words, a pattern of photoresist film is formed on the surface of the semiconductor wafer 10 that is based on whether or not the portions of the surface were exposed to light of the light source 24 passing through the photo mask 28. It will be noted that, for the sake of brevity, intermediate process steps that might be required, such as post-exposure bake and the like, are not discussed.

The lot of the exposed and developed semiconductor wafers 12 is then passed to the overlay measurement tool 50. The overlay measurement tool 0 can be an integral part of fabrication unit 1, although other configurations are conceivable as well. In the actual exposure step the overlay marks 71 that correspond to the reference marks 74 of a specific layer have been exposed to the photoresist layer. After the development step these overlay marks 71 are visible in the developed photoresist layer and are termed photoresist marks 75.

Figure 3A:
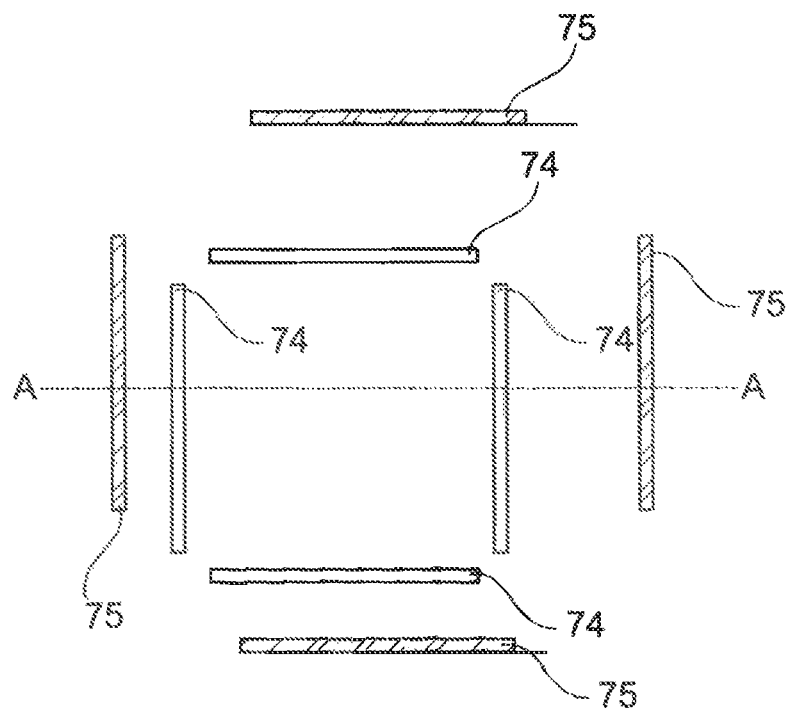
FIG. 3A shows first overlay marks and second overlay marks from a top view.
Figure 3B:
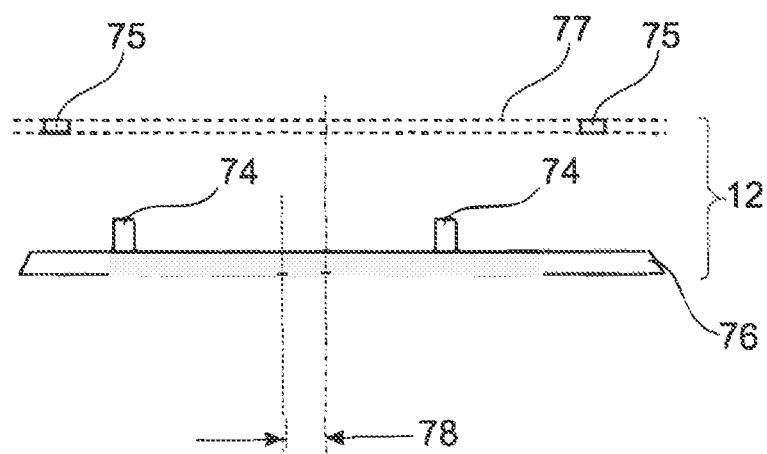
FIG. 3B shows first overlay marks and second overlay marks from a cross-section view.

FIG. 3 shows a typical pattern used for the reference marks 74 and the photoresist marks 75. FIG. 3A shows the reference marks 74 and the photoresist marks 75 from a top view and FIG. 3B shows the same reference marks 74 and the photoresist marks 75 as a cross sectional view along the line A-A of FIG. 3A. Some of the reference marks 74 may have been placed initially on the semiconductor wafer 10 at the beginning of the process during a first level lithography or in a special zero level lithography. Other ones of the reference marks 74 (for reasons of clarity not shown in FIG. 3) may have been placed in a later process step on a now intermediate layer.

The reference marks 74 can also be created on the unprocessed semiconductor substrate 76 that will later be part of the semiconductor wafer 10. The semiconductor wafers 10 then undergo many processing steps such as wet etching, dry etching, chemical mechanical planarization (CMP), oxide growth, metal deposition, to name a few. These processing steps change the appearance of the reference marks 74. As the later added layers are substantially transparent the reference marks 74 of different ones of the layers may be simultaneously visible.

The overlay measurement tool 50 measures the relative deviation 78 between corresponding reference marks 74 and photoresist marks 75. The deviations 78 may be measured as deviations in x-direction and y-direction. However, other measurement parameters, such as polar coordinates are conceivable as well.

Figure 2B:
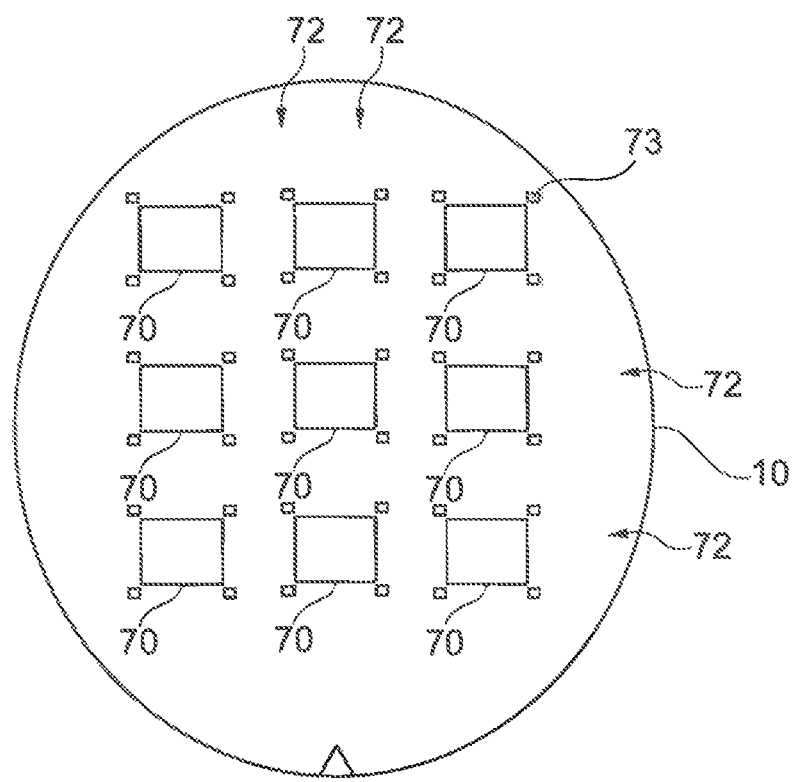
FIG. 2B shows another wafer with exposure fields.

FIGS. 2A and 2B shows as one aspect of the present disclosure overlay marks 71 that are used on the exposed and developed semiconductor wafer 12. FIG. 2A shows a surface view of four individual overlay marks 71 in each one of the exposure fields 70. FIG. 2B shows a similar figure to FIG. 2A but it is clear from FIG. 2B that there are scribe lines 72 between the various chips, e.g. the various exposure fields 70. The overlay marks 71 are placed within scribe lines 72 in this FIG. 2B.

The overlay measurements on the exposure fields 70 of the semiconductor wafers 10 are done for two reasons. The first reason is to determine the disposition of the photoresist pattern with respect to the lower layers, e. g. determine whether there is a good value of the overlay or whether the overlay error is large. In case the disposition of the photoresist patter is so large that a deposition layer created in the next process step would not match with the layers underneath and would cause a failure of the manufacture semiconductor chip, the photoresist film 77 with the photoresist pattern can be removed from the upper surface of the exposed and developed semiconductor wafer 12. In this case, after removal of the photoresist film 77, the semiconductor wafer 12 can be coated with a new photoresist film 77 and finally can be exposed again in the exposure tool 20 to create a new photoresist pattern.

The second reason for the overlay measurements is to use the overlay measurements to calculate individual process correction parameters for each exposure field 70, which are then used to compensate for process errors (as noted briefly above). The overlay measurement can also be used to simulate overlay corrections.

It is shown in FIGS. 2A and 2B that several overlay marks 71 are created which form a test structure for each exposure field 70 for each single overlay measurement. A common approach is to arrange an overlay mark 71 at each corner of the exposure field 70 and one overlay mark 71 in the middle of each exposure field 70. Other patterns of the test structure are conceivable. The measured deviations between the several overlay marks 71 of a test structure for each exposure field 70 with respect to the reference marks 74 are used to determine a plurality of overlay correction parameters for each individual exposure field 70 as well as overlay correction parameters for the wafer 10. There are at least ten overlay correction parameters which usually are applied:

Wafer translation in x-direction and y-direction ($T_x$, $T_y$)

Wafer magnification in x-direction and y-direction ($M_x$, $M_y$)

Wafer rotation in x-direction and y-direction ($R_x$, $R_y$)

Field magnification in x-direction and y-directions ($FM_x$, $FM_y$)

Field rotation in x-direction and y-direction ($FR_x$, $FR_y$)

The overlay correction parameters $T_x$, $T_y$, $M_x$, $M_y$, $R_x$ and $R_y$ are the wafer fine correction parameters, i.e. they operate at the wafer level. The overlay correction parameters $T_x$, $T_y$, $FM_x$, $FM_y$, $FR_x$ and $FR_y$ are the overlay correction parameters for each of the exposure fields. The overlay correction parameters $T_x$, $T_y$, $FM_x$, $FM_y$, $FR_x$ and $FR_y$ have both a wafer fine component and a field fine component. In other words, for each of the exposure fields 70 there is an overlay correction parameter calculated across the whole of the wafer and another overlay correction parameter that is specific to the exposure field 70, as described above.

The overlay measurement toll 50 of the present disclosure measures only a subset of the exposed and developed semiconductor wafers 12 of the whole lot. The measured data of the subset of the exposed and developed semiconductor wafers 12 is used to estimate data for other ones of the exposed and developed semiconductor wafers 12 of the lot that has not been selected for the overlay measurement. A subset for a lot of twenty-five semiconductor wafers for example could comprise three wafers. The number of semiconductor wafers 12 picked for measurement is user configurable as well as the selection strategy. Obviously, the more samples of the semiconductor wafers 12 that are chosen the more accurate the estimated data will be. If the statistical variations of the semiconductor manufacturing process are relatively low, a smaller number of samples of the semiconductor wafers 12 will suffice to obtain sufficiently accurate estimations. If the statistical variations increase the number of selected semiconductor wafers may be increased accordingly. The teachings of this disclosure can be used to simulate the overlay measurements and establish how good the overlay remains with fewer overlay measurements.

The results of the overlay measurement are passed to the simulation processor 60 and to the exposure controller 30. Over time the exposure controller 30 has a history of stored measurements and is able to calculate estimates for the process correction parameters from historical values as well as the new overlay measurement parameters for the semiconductor wafers 10. The calculated process correction parameters are provided to the exposure tool 20 for correcting the exposure alignment for a next lot of the semiconductor wafers 10.

Figure 4:
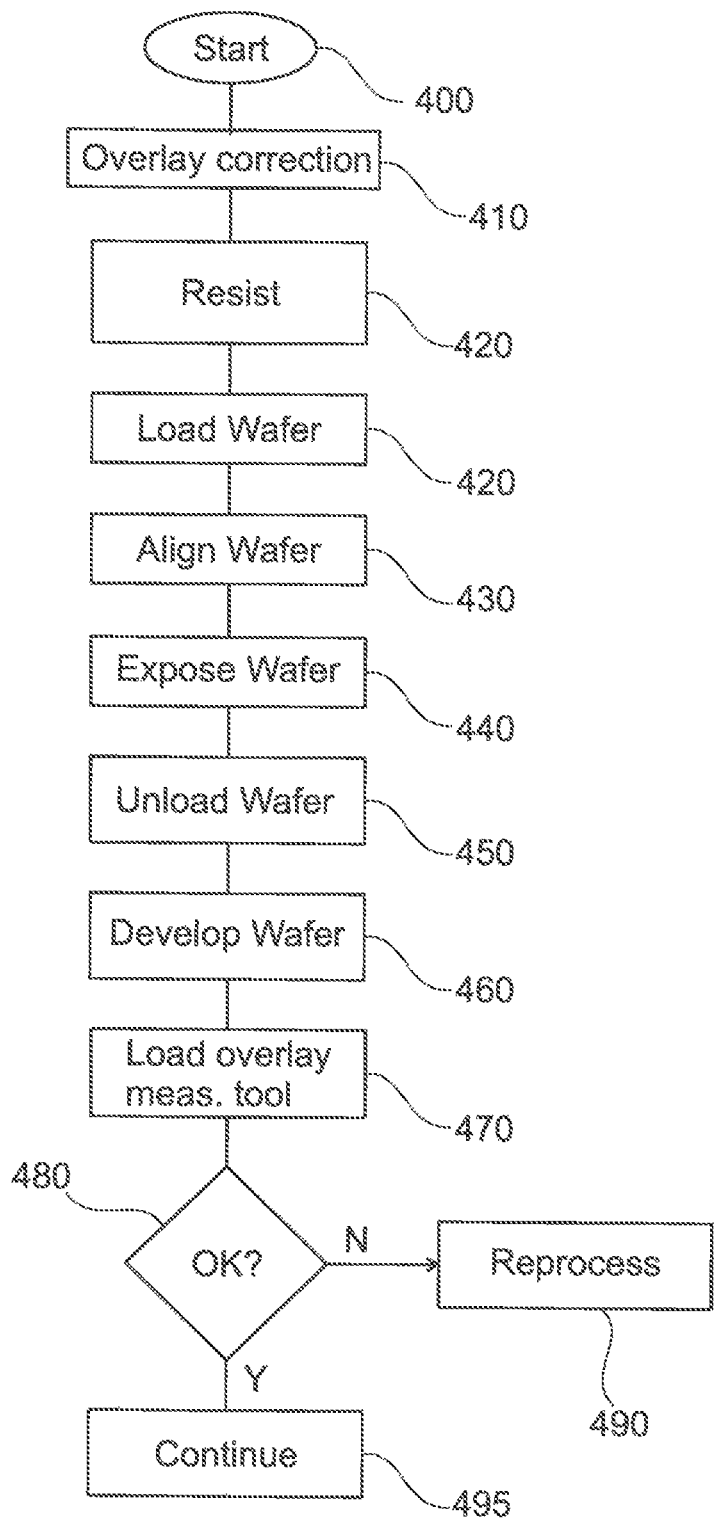
FIG. 4 shows a flow diagram of the method of this disclosure.

The method for simulating the overlay is shown in FIG. 4 and starts at 400. In a first step, 410 an initial set of process corrections is fed into the exposure tool 20 and the semiconductor wafer 10 covered with the photoresist layer in step 420. The initial set of process corrections comprises generally the process correction parameters calculated for the previous lot but could include newly calculated process correction parameters or simulated process correction parameters that are to be tested in a real environment. In a load step 420, the coated semiconductor wafer 10 is loaded into the exposure tool 20. In an alignment step 430 the semiconductor wafer is aligned in the exposure tool 20 using the alignment marks. The measured alignment data are recorded and passed to the simulation processor 60 for later processing. After alignment, the exposure field 70 of the semiconductor wafer 10 is exposed in exposure step 440 using the set of process corrections with the process correction parameters and the alignment corrections, i.e. the result of the alignment measurement. These process correction parameters and the measured alignment data are stored in the non-volatile memory of the simulation processor 60.

The last two steps are repeated (steps 430 and 440) until all exposure fields 70 of the wafer are exposed in the exposure tool 20. In an unload step 450 the exposed wafer 11 is unloaded and developed in step 460 in the developing unit 30. In this development step 760 the photoresist marks 75 become visible.

The exposed and developed semiconductor wafer 12 is loaded into the overlay measurement device 50 for overlay measurements in step 470. Using the measurement results of overlay measurement step 470 a decision in step 480 is taken whether to discharge the exposed and developed semiconductor wafer 12 for reprocessing in step 490 with wafer with adapted process correction parameters or to pass the exposed and developed semiconductor wafer 12 to the next process step 495. The overlay measurement results are passed to the simulation processor 60 and also to the exposure controller 30. As noted above the exposure controller 30 can use the overlay measurement results to calculate new or amended process correction parameters.

Figure 5:
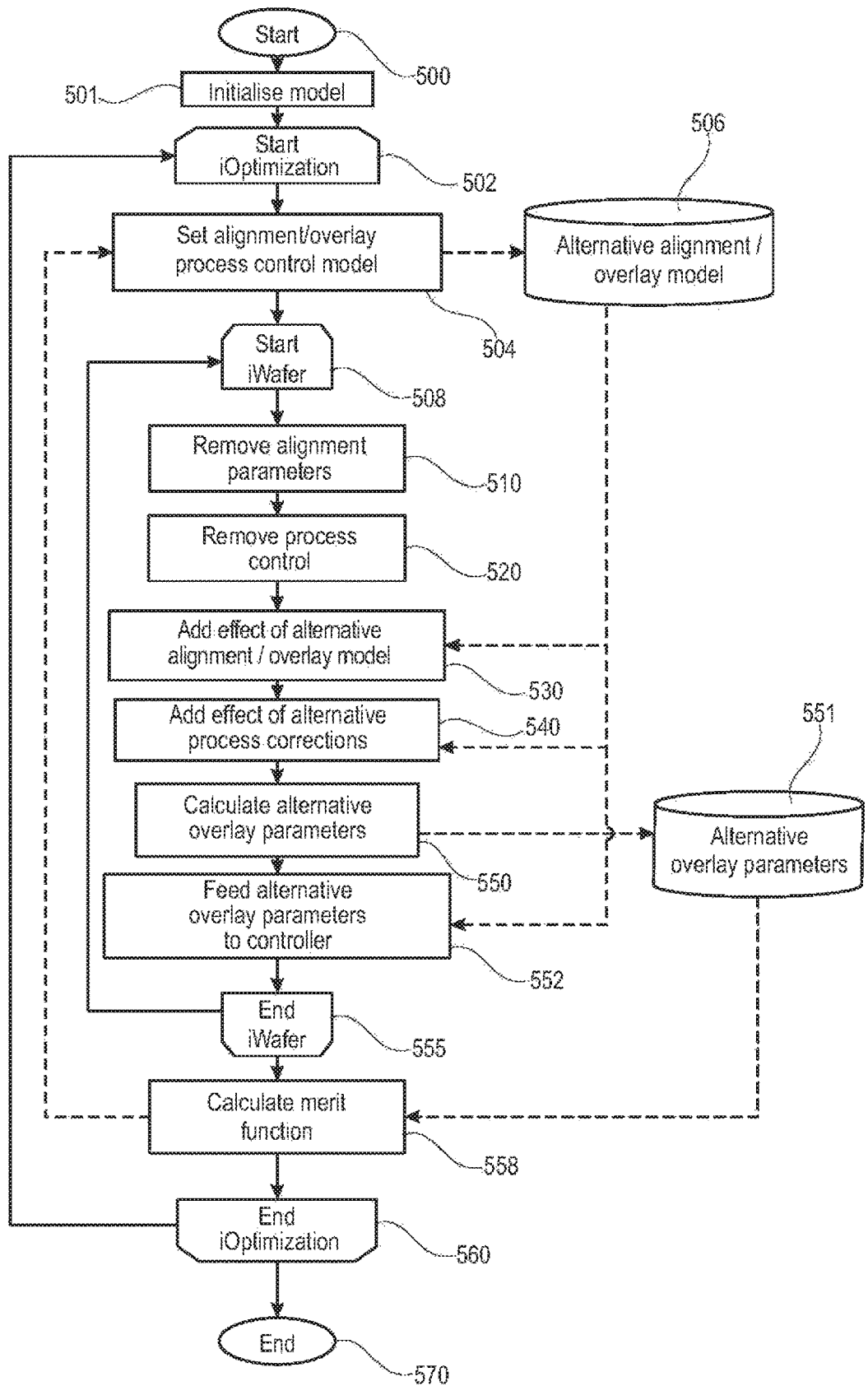
FIG. 5 shows a flow diagram of the simulation method.

The simulation and optimisation of the overlay is now explained in more detail with reference to FIG. 5. The simulation processor 60 has stored the alignment data, the process correction parameters and the overlay measurement results in the non-volatile memory.

The simulation and optimisation start at step 500. In a first step 501 an initial model for the alignment and overlay and the process control parameters for the manufacture of the semiconductor wafer 10 is initialised. This initial model can be derived from many sources. For example, the initial model could be a model that has been previously used for the processing of previous ones of the semiconductor wafers 10. The initial model could be a model that has been adapted based on expert knowledge or further experimentation. As will be explained later there are a number of optimisation options that can be carried out and a loop termed iOptimisation is formed between step 502 and step 560 (indicated by the continuous line) which concludes in step 560 after a merit function for each optimisation option has been calculated in step 558. The calculation of the merit function will be explained below.

The alignment/overlay model and the process control parameters are set in step 504 and are based either on the initial model (in the first pass of the iOptimization loop; iOptimization=1) or on a new model in subsequent passes of the iOptimization loop (iOpimization=i+1). An alternative alignment/overlay model for processing of the semiconductor wafer is derived from the alignment/overlay model and the process control parameters set in step 504 and is calculated in step 506. The dotted arrows from step 506 show that the alternative alignment overlay model is passed to steps 530 and 552, as will be explained later. The methods used for the calculation of the alternative overlay parameters are many-varied. For example, bid data processing algorithms could be used to identify potential optimal overlay parameters. It would be further possible to use a larger or small number of processing parameters or sampling rates. Experimentation will indicate to the processing engineer to test which are the best models to use.

A loop (termed iWafer) is then started in step 508 for each one of the semiconductor wafers 10, after the first semiconductor wafer 10 in the lot (semiconductor wafer no. 1 is i=1), and the iWafer loop ends in step 555 after the last or nth semiconductor wafer 10 (i.e. i=n) in the lot has been processed. Mathematically this can be expressed as iWafer=2 to n in which there are n semiconductor wafers 10 in the lot. In step 510 the alignment corrections, i.e. the result of the alignment, from the alignment data of the previous semiconductor wafer 10 (i.e. iWafer=i−1) are subtracted from the overlay measurement results of the current semiconductor wafer (i.e. iWafer=i).

In step 520, the corrections due to the process control parameters from the previous semiconductor wafer (iWafer=i−1) are removed from the overlay measurement results subsequent to the removal of the alignment data. This results in "cleansed" overlay measurement data.

The alternative alignment/overlay model for the current semiconductor wafer (iWafer=i) can be calculated either by a process engineer or by automatic modelling in step 506 (as noted above). This alternative alignment/overlay model results in alternative alignment corrections that are added in step 530 to the cleansed overlay measurement data calculated in step 520 to result in a modified overlay measurement.

The simulation processor 60 also calculates from the alternative model alternative process corrections in step 540 and these are added to the modified overlay measurement. This results in alternative overlay data. This alternative overlay data is the overlay data that would have been measured had the alternative alignment/overlay model been used in the processor of the semiconductor wafer.

The alternative overlay data can be used in step 550 in the simulation processor 60 to calculate alternative overlay parameters, such as magnification, rotation and translation that would have been used. These are stored in step 551 for later use. The alternative overlay parameters are used to calculate updated process corrections for the next semiconductor wafer (iWafer=i+1) and fed to the exposure controller 20 in step 552. The iWafer loop ends in step 555 when all of the n semiconductor wafers 10 have been processed.

The iOptimisation loop 502 to 555 enables a merit function to be calculated in step 558 based on the alternative overlay parameters calculated in step 550 and stored in step 551. The optimisation tool uses the results of measurements on the semiconductor wafer and the process conditions acquired during operation to calculate the merit function in step 558 for the alternative overlay parameters generated in step 506 which is then used by the optimisation tool for further use. The process ends in step 570.

The merit function is a quality metric per combination of alignment/overlay model and process control settings. This merit function can for instance be based on the length of the worst overlay vectors, but it will be appreciated that other methods are possible as well. As noted above, the overlay vectors are the vectors created from the deviation between the overlay marks on different layers.

In one aspect of the method, the optimisation tool uses expert knowledge about the properties of the semiconductor wafers and the process conditions acquired during operation. The optimised alignment/overlay model together with the control process parameters can, in this aspect then either be passed to the exposure controller 20 or can be passed back to the start 502 for further calculation and optimization. The expert knowledge can be generated by a method using principle component analysis (PCA) of the measured properties of the semiconductor wafers and the process conditions to identify those factors which affect the processing of the semiconductor wafers. Another method for generation of the expert knowledge is so called "breakdown" of the acquired data about the properties of the semiconductor wafers and the process conditions.

The optimization tool uses a machine learning approach with a multi-dimensional space for different ones of the parameters, for instance a neural network, to determine out of a variety of the parameters, i.e. alignment/overlay/process control model settings and the resulting quality metrics, which next optimization step should be tried out. It will be appreciated that, because the number of variables in the alignment/overlay/process control model is very large, typically, only a sub-set of such model settings will be applicable for varying. For instance, only a sub-set of all alignment settings could be verified.

The present disclosure further relates to a computer program product embedded on a computer readable medium. The computer program product comprises executable instructions for the measurements on the semiconductor wafers and the manufacture of wafers, as well as the simulation.

While various embodiments of the present invention have been described above, it should be understood that they have been presented by way of example, and not limitation. It will be apparent to persons skilled in the relevant arts that various changes in form and detail can be made therein without departing from the scope of the invention. For example, in the present disclosure, the semiconductor wafer has been exposed to a light source, such as an ultra-violet light source. However, it is well known to use other sources of illumination, such as electron beams, x-rays or similar sources of electromagnetic energy with wavelengths much shorter than light. Thus, the present invention should not be limited by any of the above-described exemplary embodiments but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device) to control the exposure tool, the exposure controller and the overlay measurement tool, implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments but should be defined only in accordance with the following claims and their equivalents.

What is claimed is:

1. A method for simulation of lithography overlay comprising:
   storing alignment parameters used to align a semiconductor wafer prior to a lithography step;
   storing process control parameters used during the lithography step on the semiconductor wafer;
   measuring overlay data of the semiconductor wafer using an overlay measurement device after the lithography step;
   determining overlay parameters from the overlay data;
   storing the overlay parameters;
   subtracting from the stored overlay parameters the alignment parameters and the process control parameters to produce cleansed overlay measurement data;
   determining an alternative alignment/overlay model;
   calculating, from the alternative alignment/overlay model, alternative alignment parameters and alternative process control parameters;
   adding the alternative alignment parameters and the alternative process control parameters to the cleansed overlay measurement data to produce simulated overlay data;
   calculating updated process corrections based on the simulated overlay data; and
   sending the updated process corrections to an exposure device to correct exposure alignment of a next semiconductor wafer.

2. The method of claim 1, further comprising visualising the simulated overlay data.

3. The method of claim 1, wherein the determining of an alternative alignment/overlay model comprises simulating a reduction of measurements.

4. The method of claim 1, wherein the overlay parameters are measured between different layers using at least one of overlay marks, test structures or defined distances between structures.

5. The method of claim 1, further comprising an optimisation step during calculation of the alternative alignment parameters and the alternative process control parameters.

6. An apparatus for the simulation of lithography overlay on a surface of a semiconductor wafer comprising:
an overlay measurement device configured to measure overlay data of the semiconductor wafer;
a non-volatile data store for storing alignment parameters, used to align a semiconductor wafer prior to a lithography step, process control parameters, used during the lithography step, and the overlay data received from an overlay measurement tool;
a simulation processor for determining an alternative alignment/overlay model and calculating, from the alternative alignment/overlay model, alternative alignment parameters and alternative process control parameters, wherein the simulation processor is further configured to subtract the stored alignment parameters and the stored process control parameters from the overlay data to obtain cleansed overlay data and subsequently to add the alternative alignment parameters and the alternative process control parameters to the cleansed overlay data to obtain simulated overlay measurement data; and
an exposure device generating exposure fields on the surface of the semiconductor wafer, wherein the exposure device has an alignment measurement device for measuring the alignment parameters of the semiconductor wafer in the exposure device and passage of measured alignment data to the non-volatile data store;
wherein the simulation processor is further configured to calculate updated process corrections from the simulated overlay data and send the updated process corrections to the exposure device to correct exposure alignment of a next semiconductor wafer.

7. The apparatus of claim 6, wherein the overlay measurement device measures overlay data between at least ones of overlay marks, test structures or defined distances between structures.

8. The apparatus of claim 6, further comprising a visualisation device for visualising the simulated overlay measurement data.

* * * * *